(12) United States Patent
Yuasa (10) Patent No.: US 11,820,593 B2
(45) Date of Patent: Nov. 21, 2023

(54) TRANSPORT VEHICLE SYSTEM

(71) Applicant: Murata Machinery, Ltd., Kyoto (JP)

(72) Inventor: Yoshiki Yuasa, Inuyama (JP)

(73) Assignee: Murata Machinery Ltd., Kyoto (JP)

(*) Notice: Subject to any disclaimer, the term of this patent is extended or adjusted under 35 U.S.C. 154(b) by 79 days.

(21) Appl. No.: 17/441,312

(22) PCT Filed: Feb. 10, 2020

(86) PCT No.: PCT/JP2020/005032
§ 371 (c)(1),
(2) Date: Sep. 21, 2021

(87) PCT Pub. No.: WO2020/195240
PCT Pub. Date: Oct. 1, 2020

(65) Prior Publication Data
US 2022/0161999 A1    May 26, 2022

(30) Foreign Application Priority Data
Mar. 22, 2019    (JP) ................................. 2019-055601

(51) Int. Cl.
*B65G 1/04*    (2006.01)
*H01L 21/677*    (2006.01)

(52) U.S. Cl.
CPC ...... *B65G 1/0457* (2013.01); *H01L 21/67706* (2013.01); *H01L 21/67724* (2013.01); *B65G 2201/0297* (2013.01)

(58) Field of Classification Search
CPC ......... H01L 21/67766; H01L 21/67769; H01L 21/6773; H01L 21/67733; H01L 21/67736;
(Continued)

(56) References Cited

U.S. PATENT DOCUMENTS 9,620,397 B2 * 4/2017 Doherty ............... B65G 1/0457
10,734,267 B2    8/2020 Motoori
(Continued)

FOREIGN PATENT DOCUMENTS

EP    3 336 016 A1    6/2018
JP    2012-25573 A    2/2012
(Continued)

OTHER PUBLICATIONS

Extended European Search Report dated Oct. 19, 2022, of counterpart European Patent Application No. 20777233.6.

*Primary Examiner* — Glenn F Myers
(74) *Attorney, Agent, or Firm* — DLA Piper LLP (US)

(57) ABSTRACT

Provided is a transport vehicle system SYS1 in which: an overhead transport vehicle includes a main body, a holder, a lift driver, and a lateral extender; a port pitch P is less than the overall length VL of the overhead transport vehicle in an extending direction D; and a first portion, which is raised or lowered by the lift driver moved in a lateral direction by a lateral extender, of an overhead transport vehicle stopped at a first position P1 on a first track for transferring an article W to a first transfer location S1 is offset in the extending direction D from a second portion, which is moved in a lateral direction by means of the drive of a lateral extender, of an overhead transport vehicle stopped at a second position P2 on the second track for transferring an article W to a second transfer location S2.

11 Claims, 7 Drawing Sheets

(58) Field of Classification Search
CPC ........ H01L 21/67724; H01L 21/67706; B65G 1/0464; B65G 1/0428; B65G 1/0457; B65G 2201/0297; B61B 3/02
See application file for complete search history.

(56) References Cited

U.S. PATENT DOCUMENTS

| | | | |
|---|---|---|---|
| 11,069,549 B2 | 7/2021 | Wada | |
| 2004/0126208 A1* | 7/2004 | Tawyer | H01L 21/67733 414/222.02 |
| 2006/0222479 A1* | 10/2006 | Shiwaku | B65G 1/0457 414/267 |
| 2019/0006217 A1* | 1/2019 | Motoori | H01L 21/67724 |
| 2020/0270102 A1* | 8/2020 | Wada | B66C 13/06 |

FOREIGN PATENT DOCUMENTS

| | | |
|---|---|---|
| WO | 2017/029871 A1 | 2/2017 |
| WO | 2018/088089 A1 | 5/2018 |
| WO | 2019/035286 A1 | 2/2019 |

* cited by examiner

TRANSPORT VEHICLE SYSTEM

TECHNICAL FIELD

This disclosure relates to a transport vehicle system.

BACKGROUND

A transport vehicle system is used in semiconductor manufacturing factories. A transport vehicle system transports articles such as FOUPs accommodating semiconductor wafers or reticle pods accommodating reticles by overhead transport vehicles, and transfers the articles to transfer locations such as load ports of a processing apparatus. In such a transport vehicle system, a plurality of transfer locations are arranged along the extending direction of the track on which the overhead transport vehicles travel. An overhead transport vehicle travels along the track, stops at a position corresponding to a transfer location, and then raises or lowers a holder that holds an article to thereby transfer the article to the transfer location. To improve the efficiency of transporting articles, a configuration has been proposed in which two tracks, namely an upper track and a lower track, are installed, and articles are transferred from the overhead transport vehicles traveling on the respective tracks to transfer locations (for example, see International Publication No. 2017/029871).

In a transport vehicle system, the efficiency of transporting articles can be further improved if the articles can be transferred to adjacent transfer locations simultaneously or concurrently. When transferring articles from two overhead transport vehicles on the same track to adjacent transfer locations at the same time, if the port pitch, which is an arrangement interval between the adjacent transfer locations, is less than the overall length of the overhead transport vehicle in the extending direction, the two overhead transport vehicles cannot simultaneously stop at positions corresponding to the respective adjacent transfer locations, and transfer of the articles cannot be performed simultaneously or concurrently.

It could therefore be helpful to provide a transport vehicle system capable of transferring articles to adjacent transfer locations simultaneously or concurrently even when the port pitch of the adjacent transfer locations is less than the overall length of the overhead transport vehicle in the extending direction.

SUMMARY

A transport vehicle system comprises: a first track; a second track that is provided below the first track and extends in the same extending direction as that of the first track; and an overhead transport vehicle that travels on the first track and the second track and transfers articles to a first transfer location and a second transfer location adjacent to each other in the extending direction; wherein the overhead transport vehicle includes a main body, a holder that holds an article, a lift driver that raises or lowers the holder, and a lateral extender that moves the lift driver from the main body in a lateral direction; a port pitch, which is an arrangement interval between the first transfer location and the second transfer location, is less than the overall length of the overhead transport vehicle in the extending direction; and a first portion, which is raised or lowered by the lift driver moved in a lateral direction by the lateral extender, of an overhead transport vehicle stopped at a first position on a first track for transferring an article to a first transfer location is offset in the extending direction from a second portion, which is moved in a lateral direction by the drive of the lateral extender, of an overhead transport vehicle stopped at a second position on the second track for transferring an article to a second transfer location.

The first portion may include an article held in the holder. In a plan view, the first portion may be within the outer edge of the second portion. The overhead transport vehicle may include an auxiliary that, when the lateral extender causes the lift driver to move laterally, is moved laterally together therewith, and the auxiliary may be included in the second portion. In the extending direction, the range of the second portion of the overhead transport vehicle stopped at the first position and the range of the second portion of the overhead transport vehicle stopped at the second position may partially overlap with each other.

According to the above transport vehicle system, when an overhead transport vehicle on the first track and an overhead transport vehicle on the second track transfer articles simultaneously or concurrently to the first transfer location and the second transfer location, the port pitch of which is less than the overall length of the overhead transport vehicle in the extending direction, since the first portion of the overhead transport vehicle on the first track is offset in the extending direction from the second portion of the overhead transport vehicle on the second track, it is possible to prevent interference between the overhead transport vehicles, that is, interference between the first portion of the overhead transport vehicle on the first track and the second portion of the overhead transport vehicle on the second track. As a result, the overhead transport vehicles can simultaneously or concurrently transfer articles to the first transfer location and second transfer location adjacent to each other, and the efficiency of transporting articles can be improved.

In a configuration in which the first portion includes an article held by the holder, it is possible to prevent the article held by the holder from interfering with the second portion of the overhead transport vehicle on the second track. In a configuration in which the first portion is within the outer edge of the second portion as viewed in a plan view, the first portion does not protrude from the second portion as viewed in the plan view and, as a result, the overhead transport vehicles can simultaneously or concurrently transfer articles to the first transfer location and second transfer location having such a port pitch therebetween that the second portion of the overhead transport vehicle on the first track and the second portion of the overhead transport vehicle on the second track would be adjacent to each other or would overlap with each other as viewed in the plan view.

In a configuration in which the overhead transport vehicle includes an auxiliary that, when the lateral extender causes the lift driver to move laterally, is moved laterally together therewith, and the auxiliary is included in the second portion, by having the auxiliary, which is moved laterally, included in the second portion, it is possible to reliably prevent interference between the first portion of the overhead transport vehicle on the first track and the second portion of the overhead transport vehicle on the second track.

In a configuration in which in the extending direction, the range of the second portion of the overhead transport vehicle stopped at the first position and the range of the second portion of the overhead transport vehicle stopped at the second position partially overlap with each other, the overhead transport vehicle on the first track and the overhead transport vehicle on the second track can transfer articles simultaneously or concurrently to the first transfer location and the second transfer location, the port pitch of which is less than the second portion.

DESCRIPTION OF REFERENCE SIGNS

D: Extending direction
F, W: Article
P: Port pitch
P1: First position
P2: Second position
S1, S3: First transfer location
S2: Second transfer location
SYS1, SYS2: Transport vehicle system
10: First track
20: Second track
30, 30A, 30B: Overhead transport vehicle
31: Traveler
32: Main body
33: Holder
34: Lift driver
35: Lateral extender
36: Auxiliary
38, 38A, 38B: First portion
39, 39A, 39B: Second portion

DETAILED DESCRIPTION

The following describes examples with reference to the drawings. However, my systems are not limited to the examples. In the drawings, scale is changed as necessary to illustrate the examples such as by enlarging or emphasizing a portion. In the following drawings, an XYZ coordinate system is used to describe the directions in each drawing. In the XYZ coordinate system, the vertical direction is taken as the Z direction, and the horizontal directions are taken as the X direction and the Y direction. The X direction is one direction in the horizontal direction, and is the extending direction D along a first track and a second track, which will be described later. The Y direction is a direction orthogonal to the X direction. Also, in each of the X, Y, and Z directions, where appropriate, the orientation indicated by the arrow is expressed as a + direction (for example, +X direction), and the direction opposite thereof is expressed as a − direction (for example, −X direction). In the following examples, the traveling direction of an overhead transport vehicle 30 is described as the X direction, and the lateral direction is described as the Y direction. The traveling direction (X direction) of the overhead transport vehicle 30 is an arbitrary orientation.

First Example

Figure 1:
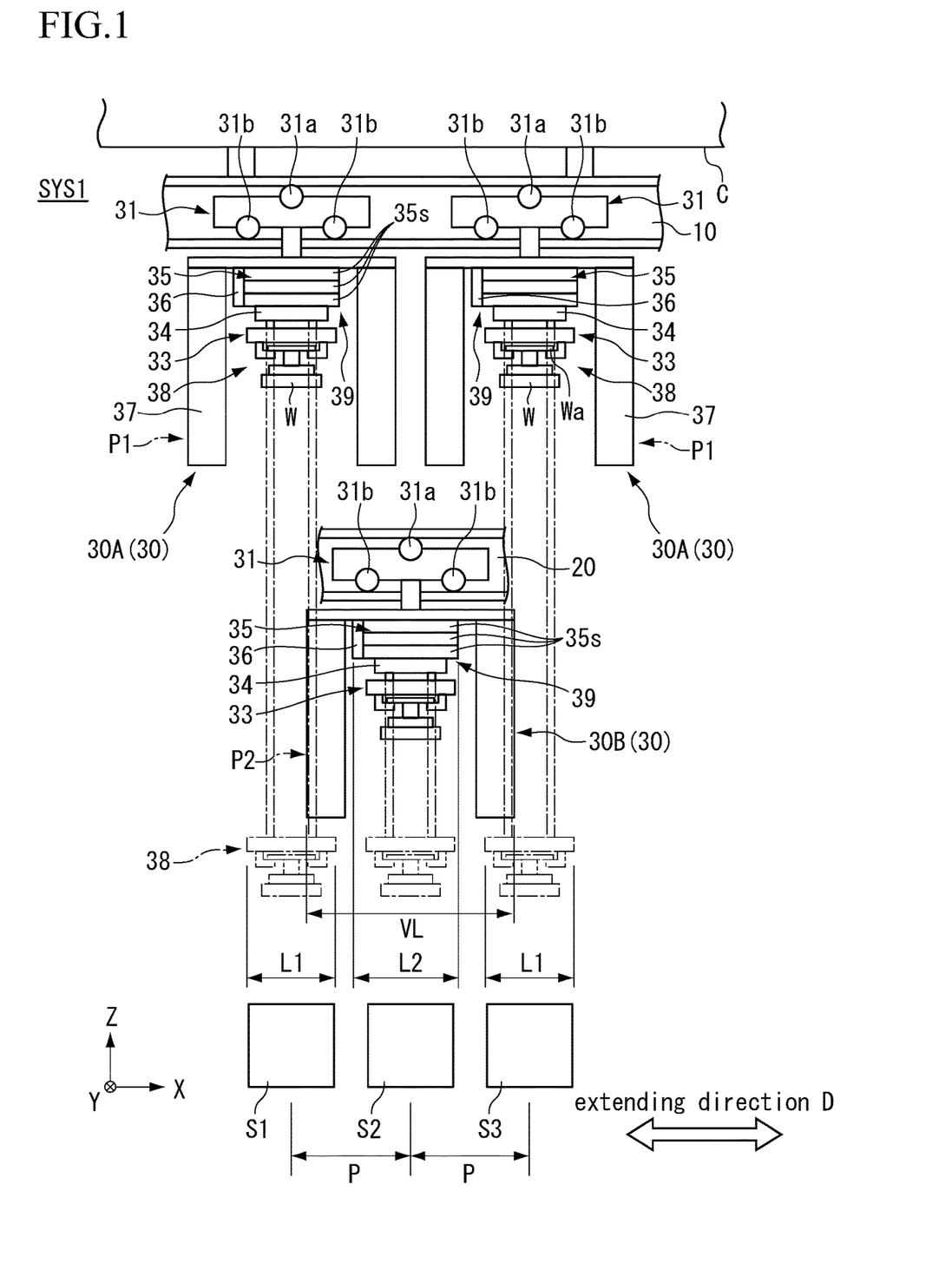
FIG. 1 is a diagram showing an example of a transport vehicle system as viewed in the Y direction.

FIG. 1 is a diagram showing a first example of a transport vehicle system SYS1 as viewed in the Y direction. The transport vehicle system SYS1 shown in FIG. 1 is installed in a semiconductor device manufacturing factory or the like, and transports articles W such as reticle pods accommodating reticles or FOUPs accommodating semiconductor wafers used to manufacture semiconductor devices. The transport vehicle system SYS1 transports articles W to and from transfer locations where the articles W can be placed (for example, a first transfer location S1 described later) by the overhead transport vehicles 30. In this example, articles W are reticle pods. However, the articles W may be another type of articles other than reticle pods. The transport vehicle system SYS1 can also be applied to facilities in fields other than that in the semiconductor manufacturing field, and the articles W may be another type of articles that can be transported in the transport vehicle system SYS1.

The transport vehicle system SYS1 includes a first track 10, a second track 20, and overhead transport vehicles 30. The first track 10 and the second track 20 are provided, for example, in a state of being suspended by hangers H from a ceiling C or from a system ceiling provided on the ceiling C and not shown in the drawings, and are arranged in the vicinity of the ceiling C or the system ceiling not shown in the drawings. In FIG. 1, description of the hangers of the second track 20 is omitted.

The first track 10 and the second track 20 are provided along a common extending direction D. The first track 10 and the second track 20 are formed of the same or substantially the same members, and have the same or substantially the same cross-sectional shape orthogonal to the extending direction D. The second track 20 is arranged below the first track 10. A configuration of arranging the second track 20 below the first track 10 is taken as an example for the description, however, my systems are not limited to this configuration, and the second track 20 may be arranged to deviate to a lateral direction (Y direction) from directly below the first track 10.

Figure 2:
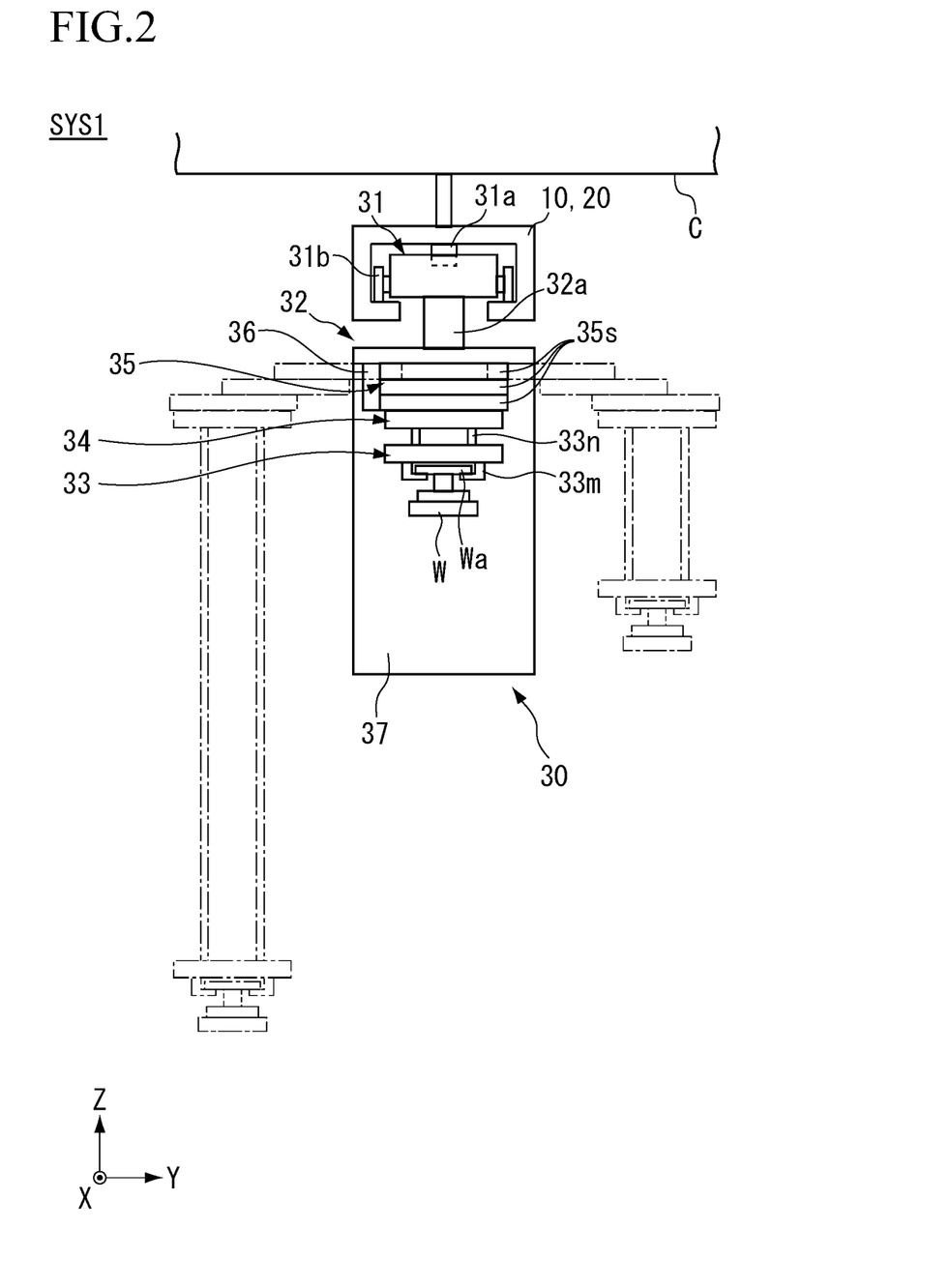
FIG. 2 is a diagram showing an example of an overhead transport vehicle.

FIG. 2 is a diagram showing a second example of the overhead transport vehicle 30. FIG. 2 shows a view of the overhead transport vehicle 30 as viewed from the traveling direction (X direction). The overhead transport vehicle 30 has a traveler 31 and a main body 32. The traveler 31 includes a traveling driver not shown in the drawings and a plurality of driving wheels 31a and driven wheels 31b, and travels along the on the first track 10 and the second track 20. The traveling driver not shown in the drawings may be, for example, an electric motor that is provided in the traveler 31 to drive the driving wheels 31a, or may be a linear motor.

The main body 32 is attached to a lower part of the traveler 31 via an attachment 32a. The main body 32 includes: a holder 33 that holds an article W; a lift driver 34 that suspends, and raises or lowers the holder 33; a lateral extender 35 causes the lift driver 34 to move in a direction lateral to the track (in the lateral direction) from the main body 32; an auxiliary 36 that, when the lateral extender 35 causes the lift driver 34 to move laterally, is moved laterally together therewith; and covers 37 (individually, 37A and 37B) that cover the holder 33, the lift driver 34, the lateral extender 35, and the auxiliary 36 from the front and the rear thereof in the traveling direction.

The holder 33 grips and holds the flange Wa of an article W from above, to thereby suspend and hold the article W. The holder 33 is, for example, a chuck having a plurality of claws 33m capable of moving forward and backward in the horizontal direction, the claws 33m are inserted under the flange Wa of the article W and the holder 33 is raised to thereby suspend and hold the article W. The holder 33 is connected to suspenders 33n such as wires or belts. The holder 33 is suspended from the lift driver 34 and is raised or lowered by the drive of the lift driver 34. The holder 33 is included in the first portion 38 driven by the lift driver 34. When the lift driver 34 drives (raises or lowers) the holder 33, the article W is held by the holder 33 and ascends or descends together with the holder 33 so that the article W held by the holder 33 is also included in the first portion 38.

The lift driver 34 is, for example, a hoist, and lowers the holder 33 by feeding out suspenders 33n and lifts the holder 33 by taking up the suspenders 33n. The lift driver 34 is controlled by a controller or the like not shown in the drawings to raise or lower the holder 33 at a predetermined speed. Also, the lift driver 34 is controlled by the controller to maintain the holder 33 at a target height.

The lateral extender 35 has a plurality of movable plates 35s stacked in the vertical direction, for example. The movable plates 35s are movable to a lateral side of the traveling direction of the traveler 31 (in a direction orthogonal to the traveling direction). The lift driver 34 is mounted on the movable plate 35s provided on the lowermost side of the plurality of movable plates 35s. The main body 32 has a guide not shown in the drawings that guides the lateral extender 35 (movable plates 35s), and a driving unit not shown in the drawings that drives the lateral extender 35.

The lateral extender 35 causes the lift driver 34 and the holder 33 to move along the guide between a projecting position and a storing position by the driving force of the driving unit such as an electric motor. Specifically, by moving the movable plate 35s laterally, the lift driver 34 mounted on the movable plate 35s is moved to the projecting position, and by storing the movable plate 35s in the main body 32, the lift driver 34 mounted on the movable plate 35s is moved to the storing position. The projecting position is a position at which the holder 33 is projected to the lateral side from the main body 32. The storing position is a position at which the holder 33 is stored within the main body 32. Between the lateral extender 35 and the lift driver 34 there may be provided a rotator that rotates the lift driver 34 (the holder 33) around an axis along the vertical direction, and between the lift driver 34 and the holder 33 there may be provided a rotator that rotates the holder 33 around an axis along the vertical direction.

The auxiliary 36 is provided on the −X side or on the +X side of the lateral extender 35 as viewed in the plan view. The auxiliary 36 is, for example, a part of the lateral extender 35. The auxiliary 36 is a housing that accommodates, for example, cables, pipes and the like and is extendable and retractable or expandable. This housing is, for example, of a configuration in which tubular bodies are swingably connected to each other, and cables or the like are arranged inside the tubular bodies. In such a housing, one end thereof is attached to a base side (fixed side) of the lateral extender 35, and the other end is attached to the movable plate 35s with the intermediate portion thereof being bent. When the movable plate 35s moves, the bent portion of the housing moves, and this causes the side attached to the movable plate 35s to move laterally together with the movable plate 35s.

The movable plate 35s of the lateral extender 35 is included in the second portion 39 that is moved laterally by the lateral extender 35. Since the auxiliary 36 is also moved laterally together with the movable plate 35s, it is included in the second portion 39.

Figure 3:
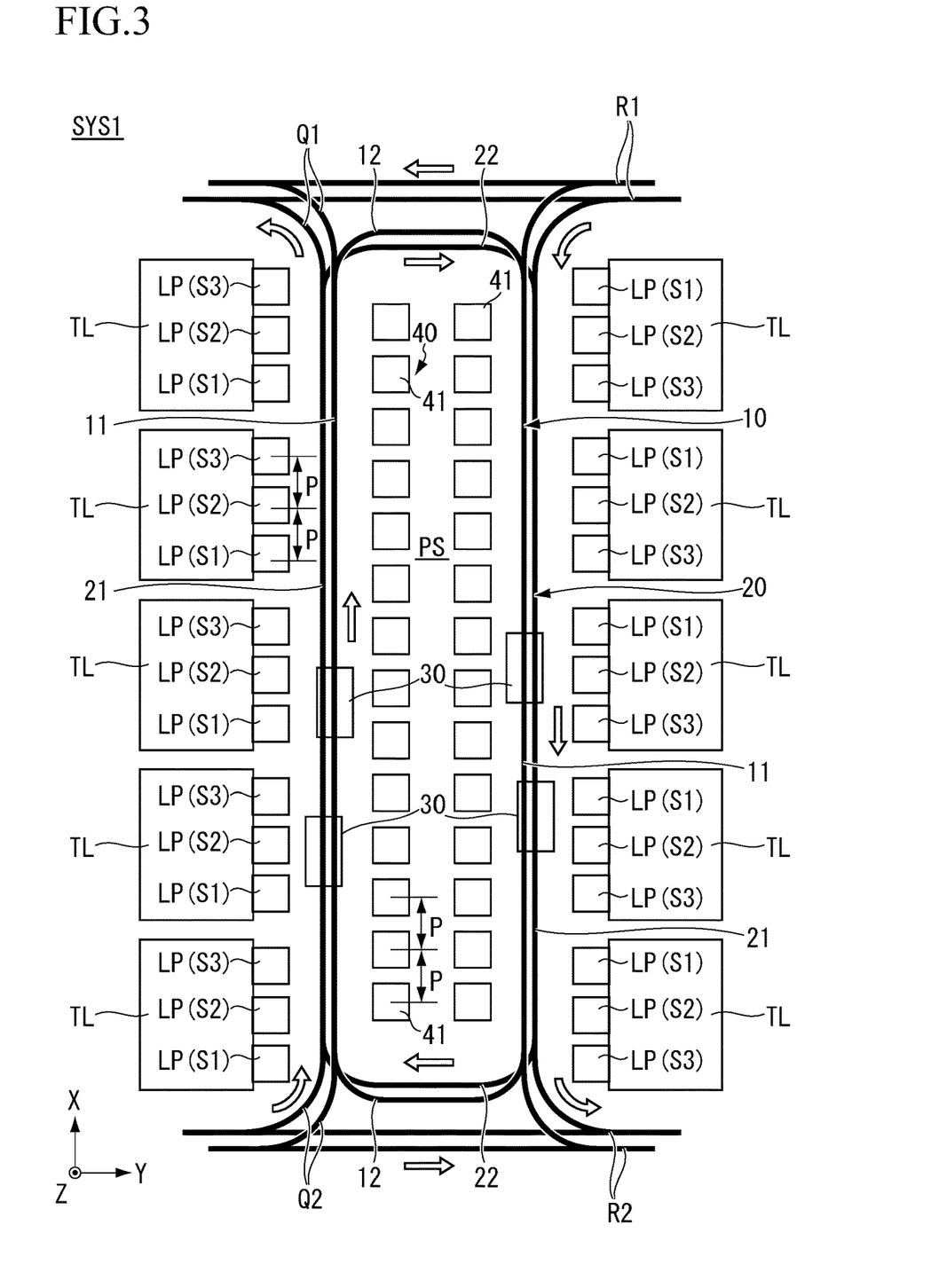
FIG. 3 is a plan view showing an example of a positional relationship between a first track, a second track, and transfer locations.
Figure 4:
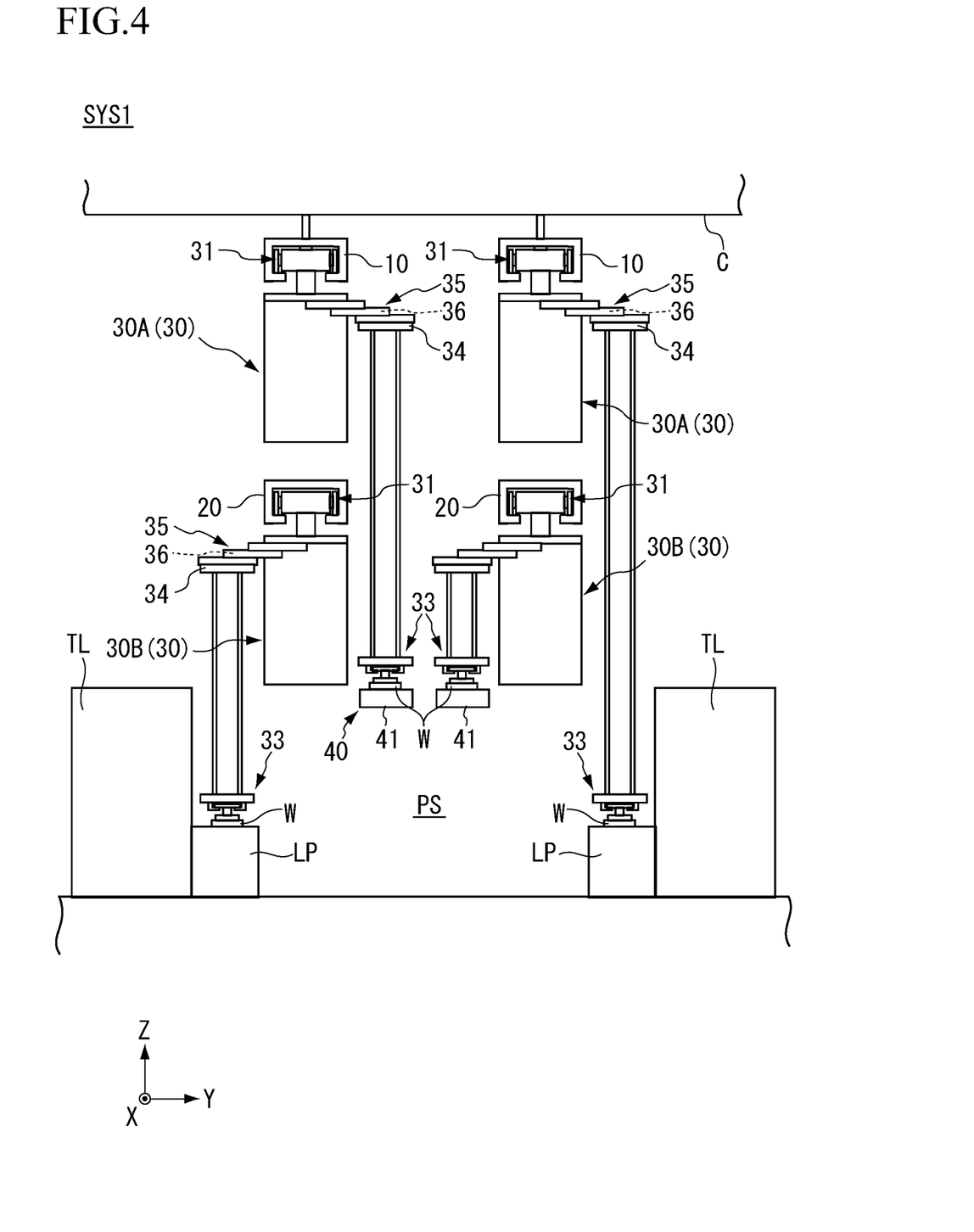
FIG. 4 is a diagram showing an example of transferring articles to transfer locations.

FIG. 3 is a plan view showing an example of a positional relationship between the first track 10, the second track 20, and load ports LP or storage 40 serving as transfer locations. FIG. 4 is a diagram showing an example of transferring articles W to the load ports LP or the storage 40 serving as transfer locations of the articles W. FIG. 4 shows the example as viewed from the traveling direction (X direction) of the overhead transport vehicles 30. As shown in FIG. 3, each of the load ports LP of processing apparatuses TL and racks 41 of the storage 40 is arranged in a direction along a straight line (X direction). The direction in which the plurality of load ports LP and the racks 41 are arranged is the extending direction D of the first track 10 and the second track 20.

The first track 10 and the second track 20 are arranged respectively between inter-bay routes (inter-bay tracks) R1 and inter-bay routes R2 as viewed in the plan view. The first track 10 and the second track 20 are both intra-bay routes provided respectively in a bay (in an intrabay). The inter-bay routes R1 or the like are provided to mutually connect a plurality of first tracks 10 and second tracks 20 provided to correspond to different bays. A bay (intra-bay) refers, for example, to a range in which load ports LP of a plurality of processing apparatuses TL are provided to face each other as viewed in the plan view, and an operator passage PS is provided therebetween. The first track 10 and the second track 20 are connected respectively to the inter-bay routes R1 via two branch tracks Q1 used to enter or exit the inter-bay routes R1, and are connected respectively to the inter-bay routes R2 via two branch tracks Q2 used to enter or exit the inter-bay routes R2.

Although not shown in the drawings, a track switcher for the overhead transport vehicles 30 to interchangeably enter the first track 10 and the second track 20 may be provided on either one or both of the inter-bay routes R1, R2. A track switcher for the overhead transport vehicles 30 to interchangeably enter the first track 10 and the second track 20 may also be provided on a part of the first track 10 and the second track 20. That is to say, the configuration may be such that the overhead transport vehicle 30 traveling on the first track 10 is allowed to enter the second track 20 while the overhead transport vehicle 30 traveling on the second track 20 is also allowed to enter the first track 10.

The first track 10 and the second track 20 each has straight parts 11, 21 and connection parts 12, 22. The straight parts 11, 21 are arranged in the X direction along the plurality of load ports LP, above and beside the load ports LP. In other words, the plurality of load ports LP serving as transfer locations of articles W, are arranged in line along the extending direction D (X direction) of the first track 10 and the second track 20. Combinations of the first and second tracks 10, 20, the upper and lower inter-bay routes R1, R2, and the branch tracks Q1, Q2 are each illustrated in FIG. 3 as being offset from each other to facilitate the description. However, they are each in fact arranged in a vertically overlapping manner as viewed in the plan view. However, as described above, the first track 10 and the second track 20, which vertically overlap with each other, may be arranged being offset from each other as viewed the plan view.

The connection parts 12, 22 are arranged at both the +X side end and at the −X side end and include curved parts, connecting the straight parts 11, 21 to each other. The first track 10 and the second track 20 formed as being circular tracks by the straight parts 11, 21 as well as the connection parts 12, 22. The overhead transport vehicles 30 can thus travel on the first track 10 and the second track 20 in a circulating manner in one direction (for example, in the clockwise direction in the plan view) along the straight parts 11, 21 and the connection parts 12, 22.

The overhead transport vehicles 30 enter the first track 10 or the second track 20 from the inter-bay routes R1, R2 via the branch tracks Q1, Q2, and exit the first track 10 or the second track 20 to the inter-bay routes R1, R2 via the branch tracks Q1, Q2. The overhead transport vehicles 30 move along the first track 10 and the second track 20, and transport articles W between, for example, the load ports LP of the processing apparatuses TL and the storage 40.

As shown in FIG. 3, the plurality of load ports LP are arranged outside the first track 10 and the second track 20 as viewed in the plan view. The plurality of racks 41 are arranged inside the first track 10 and the second track 20 as viewed in the plan view. In the example of FIG. 3, three load ports LP are arranged in a single processing apparatus TL. However, the number of load ports LP in a single processing apparatus TL may be set for each processing apparatus TL. For example, a single processing apparatus TL may have two or one load ports LP arranged therein, or a single processing apparatus TL may have four or more load ports LP arranged therein.

The load ports LP and the racks 41 are arranged being offset from directly below the first track 10 and the second track 20. After having stopped at a position on the first track 10 or the second track 20 corresponding to a load port LP or a rack 41, the overhead transport vehicle 30 can receive or deliver an article W from or to the load port LP or the rack 41 by raising or lowering the holder 33 with the lift driver 34 having been extended to a lateral side of the track by the lateral extender 35 as shown in FIG. 4.

As shown in FIG. 1, of the three load ports LP provided in a single processing apparatus TL, load ports LP adjacent to each other in the extending direction D (X direction) are referred to as first transfer location S1 and second transfer location S2, and second transfer location S2 and first transfer location S3. In the following example, there is described an example where, of the three load ports LP provided in a single processing apparatus TL, the load ports LP arranged at both ends in the X direction are respectively the first transfer locations S1, S3, and the load port LP arranged in the center in the X direction is the second transfer location S2. That is to say, the example is described in which, at the three load ports LP, the first transfer location S1, the second transfer location S2, and the first transfer location S3 are arranged in line in the above order from the −X side. The three load ports LP are arranged in line at predetermined port pitches P along the extending direction D (X direction). The port pitch P is an arrangement interval between the first transfer location S1 and the second transfer location S2, and an arrangement interval between the second transfer location S2 and the first transfer location S3. The port pitch P is less than the overall length VL (see FIG. 1) of the overhead transport vehicle 30 in the traveling direction (extending direction D). The port pitch P between the first transfer location S1 and the second transfer location S2 and the port pitch P between the second transfer location S2 and the first transfer location S3 may be the same or different.

As shown in FIG. 1, when transferring articles W to the first transfer locations S1, S3, the overhead transport vehicles 30 stopped at first positions P1 on the first track 10 are used, and when transferring an article W to the second transfer location S2, the overhead transport vehicle 30 stopped at a second position P2 on the second track 20 is used. That is to say, the first positions P1 are positions at which the overhead transport vehicles 30 stop on the first track 10 to transfer articles W to the first transfer locations S1, S3. The second position P2 is a position at which the overhead transport vehicle 30 stops on the second track 20 to transfer an article W to the second transfer location S2.

Figure 5:
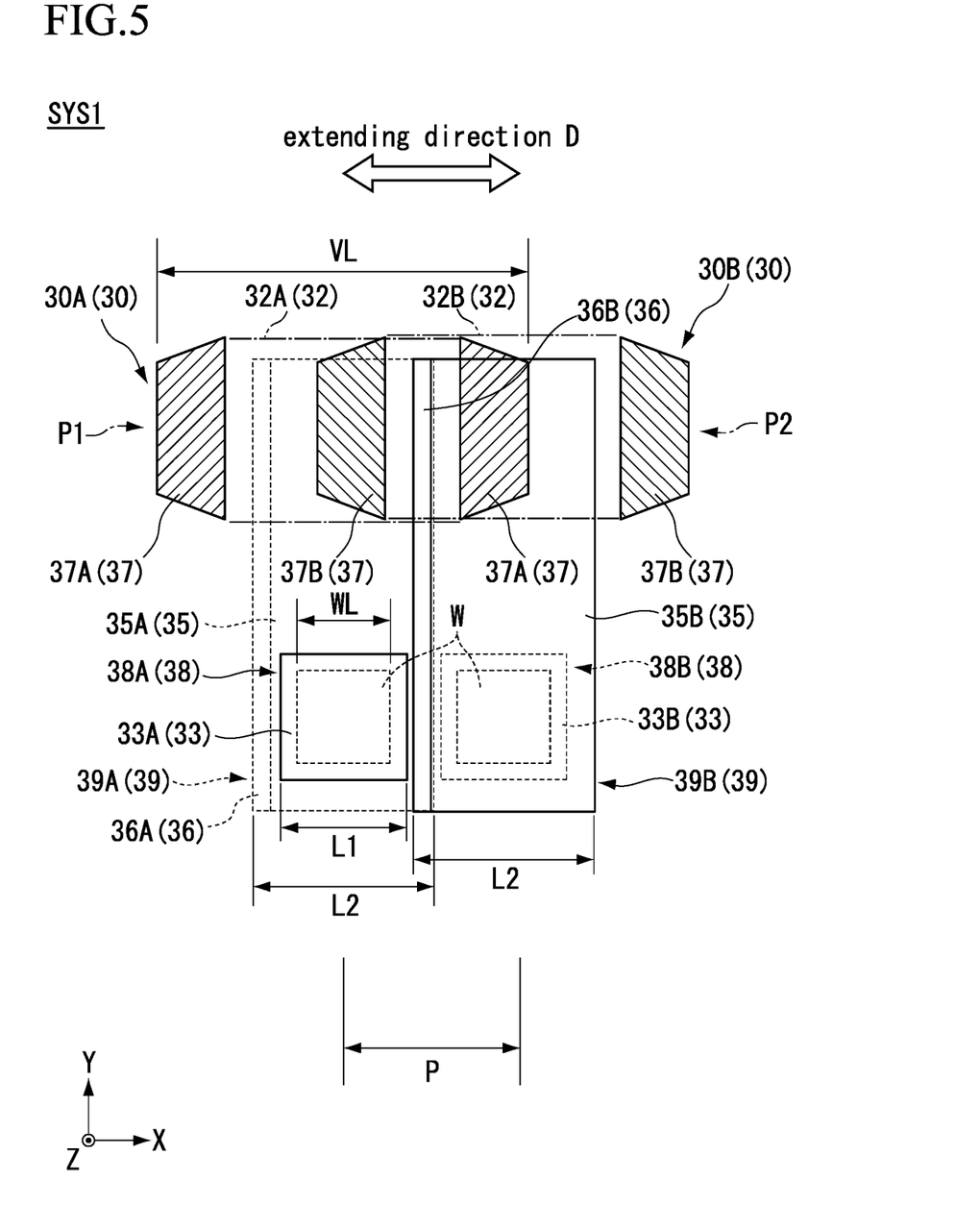
FIG. 5 is a plan view showing an example of overhead transport vehicles having stopped at a first position and a second position.

FIG. 5 is a diagram showing the first example of the overhead transport vehicles 30 having stopped at a first position P1 and a second position P2, in the transport vehicle system SYS1. FIG. 5 shows an example of transferring articles W to the first transfer location S1 and the second transfer location S2. Hereinafter, in some instances, the overhead transport vehicle 30 that stops at the first position P1 corresponding to the first transfer location S1 may be referred to as overhead transport vehicle 30A, and the overhead transport vehicle 30 that stops at the second position P2 may be referred to as overhead transport vehicle 30B to describe them separately. When distinguishing the overhead transport vehicles 30 from each other, a letter A or B is assigned to each reference sign of each configuration in the overhead transport vehicle 30.

As shown in FIG. 5, when an overhead transport vehicle 30A stops at the first position P1 and an overhead transport vehicle 30B stops at the second position P2, a part of the main body 32A of the overhead transport vehicle 30A (a portion on the +X side) and a part of the main body 32B of the overhead transport vehicle 30B (a portion on the −X side) overlap with each other as viewed in the plan view. That is to say, since the port pitch P between the first transfer location S1 and the second transfer location S2 is less than the overall length VL of the overhead transport vehicles 30A, 30B in the extending direction D, a part of the overhead transport vehicle 30A at the first position P1 and a part of the overhead transport vehicle 30B at the second position P2 overlap with each other. However, since the first track 10 and the second track 20 are arranged at different heights in the vertical direction, the overhead transport vehicle 30A and the overhead transport vehicle 30B can stop respectively at the first position P1 and the second position P2 without interfering with each other.

The overhead transport vehicle 30A having stopped at the first position P1 drives the lateral extender 35A to move the movable plates 35s (see FIG. 2) in the −Y direction, and thereby, the holder 33A (article W) including the lift driver 34 (not shown in FIG. 5) can be arranged directly above the first transfer location S1. In FIG. 5, the lateral extender 35A and the article W are shown in broken lines, and the holder 33A is shown in solid lines. The overhead transport vehicle 30B having stopped at the second position P2 drives the lateral extender 35B to move the movable plates 35s (see FIG. 2) in the −Y direction, and thereby, the holder 33B (article W) including the lift driver 34 (not shown in FIG. 5) can be arranged directly above the second transfer location S2. In FIG. 5, the lateral extender 35B is shown in solid lines, and the holder 33B and the article W are shown in broken lines.

A first portion 38A is a portion that is raised or lowered by the lift driver 34A of the overhead transport vehicle 30A, and is the holder 33A as well as the article W held by the holder 33A. A second portion 39B is a portion that is moved in the lateral direction by the drive of the lateral extender 35B of the overhead transport vehicle 30B, and is the movable plates 35s of the lateral extender 35B (see FIG. 2)

as well as the auxiliary 36B. The second portion 39B includes the holder 33B, the lift driver 34B, and the article W held by the holder 33B.

As shown in FIG. 5, as viewed in the plan view, the first portion 38A, which is raised or lowered by the lift driver 34A, of the overhead transport vehicle 30A stopped at the first position P1 on the first track 10 for transferring the article W to the first transfer location S1 is offset from the second portion 39B, which is moved in the lateral direction by the drive of the lateral extender 35B, of the overhead transport vehicle 30B stopped at the second position P2 on the second track 20 for transferring the article W to the second transfer location S2. That is to say, as shown in solid lines in FIG. 5, the first portion 38A of the overhead transport vehicle 30A stopped at the first position P1 is offset in the extending direction D (traveling direction, X direction) from the second portion 39B of the overhead transport vehicle 30B stopped at the second position P2 to not overlap with each other as viewed in the plan view. In other words, in the extending direction D, one end (+X direction side end) of the first portion 38A of the overhead transport vehicle 30A stopped at the first position P1 is set to be on the other side of the other end (−X direction side end) of the second position 39B of the overhead transport vehicle 30B stopped at the second position P2.

Therefore, even when lowering the first portion 38A from the lift driver 34A of the overhead transport vehicle 30A, the first portion 38A does not interfere with the second portion 39B of the overhead transport vehicle 30B. As a result, the overhead transport vehicle 30A on the first track 10 can transfer the article W to the first transfer location S1 and the overhead transport vehicle 30B on the second track 20 can transfer the article W to the second transfer location S2 simultaneously or concurrently.

As shown in FIG. 5, the dimension L1 of the first portion 38A in the extending direction D is less than the dimension L2 of the second portion 39A in the extending direction D, and the first portion 38A of the overhead transport vehicle 30A is within the outer edge of the second portion 39A. Similarly, the first portion 38B of the overhead transport vehicle 30B is within the outer edge of the second portion 39B. With such a configuration, articles W can be transferred simultaneously or concurrently to both the first transfer location S1 and the second transfer location S2 having such short port pitch P that the second portions 39A, 39B of the overhead transport vehicles 30A, 30B would be adjacent to each other or would partially overlap with each other as viewed in the plan view, without the first portion 38A of the overhead transport vehicle 30A and the second portion 39B of the overhead transport vehicle 30B interfering with each other.

As having been described in this example, when the dimension WL of the article W in the extending direction D is less than the dimension L1 of the holder 33A in the extending direction D and the article is within the outer edge of the holder 33 as viewed in the plan view, the dimension L1 of the holder 33A is the dimension of the first portion 38A in the extending direction D so that interference between the first portion 38A and the second portion 39B can be prevented regardless of whether or not the holder 33A is holding the article W.

When being moved laterally by the drive of the lateral extender 35, the auxiliary 36 is included in the second portion 39 as protruding outward in the extending direction D from the outer edge of the movable plates 35s as viewed in the plan view. Therefore, for example, if the auxiliary 36 overlaps with a part (for example, the movable plates 35s) of the lateral extender 35 as viewed in the plan view, even when the auxiliary 36 is moved laterally by the lateral extender 35, it may not be essential that the second portion 39 include the auxiliary 36.

Moreover, in a plan view, as shown in FIG. 5, the range of the second portion 39A of the overhead transport vehicle 30A stopped at the first position P1 and the range of the second portion 39B of the overhead transport vehicle 30B stopped at the second position P2 partially overlap with each other. With such a configuration, even when the port pitch P between the first transfer location S1 and the second transfer location S2 is less than the dimension L2 of the second portion 39, the overhead transport vehicle 30A on the first track 10 can transfer the article W to the first transfer location S1 and the overhead transport vehicle 30B on the second track 20 can transfer the article W to the second transfer location S2 simultaneously or concurrently without the first portion 38A and the second portion 39B interfering with each other.

Next, operations of the above transport vehicle system SYS1 will be described. First, an operation of delivering an article W at a storage 40 to a load port LP will be described. Operations of the transport vehicle system SYS1 are controlled by a controller not shown in the drawings. The controller not shown in the drawings controls the overhead transport vehicle 30 traveling on the first track 10 or the second track 20 to receive an article W from the storage 40. With this control, the overhead transport vehicle 30 travels along the first track 10 or the second track 20, moves to and stops above and beside the rack 41 of the storage 40, drives the lateral extender 35 to cause the lift driver 34 to extend laterally, and lowers the holder 33 by the lift driver 34 to receive the article W with the holder 33. Then, the overhead transport vehicle 30 raises the holder 33 by the lift driver 34, and drives the lateral extender 35 to return the lift driver 34 (holder 33) to the storing position, to thereby accommodate the article W in the main body 32.

Next, the controller not shown in the drawings controls the overhead transport vehicle 30 to deliver the article W to the load port LP. With this control, the overhead transport vehicle 30 travels along the first track 10 or the second track 20 while holding the article W in the holder 33, moves to and stops above and beside the load port LP, drives the lateral extender 35 to cause the lift driver 34 to extend laterally, and arranges the holder 33 (article W) directly above the load port LP. Then, after having driven the lift driver 34 to lower the holder 33 and the article W and placed the article W at the load port LP, the holder 33 releases holding of the article W to thereby deliver the article W to the load port LP.

During such an operation, the overhead transport vehicle 30A traveling on the first track 10 and the overhead transport vehicle 30B traveling on the second track 20 may, in some examples, be controlled to simultaneously or almost simultaneously deliver articles W to the first transfer location S1 and the second transfer location S2 of the adjacent load ports LP. Hence, the overhead transport vehicle 30A traveling on the first track 10 stops at the first position P1 at which the article W can be transferred to the first transfer location S1. The overhead transport vehicle 30B traveling on the second track 20 stops at the second position P2 at which the article W can be transferred to the second transfer location S2.

Then, the overhead transport vehicles 30A, 30B respectively drive the lateral extenders 35A, 35B to extend the lift drivers 34A, 34B. At this time, as described above, the range of the second portion 39A of the overhead transport vehicle 30A and the range of the second portion 39B of the overhead transport vehicle 30B partially overlap with each other (see FIG. 5). In this state, the lift drivers 34A, 34B lower the holders 33 (articles W). At this time, the first portion 38A of the overhead transport vehicle 30A is offset from the second portion 39B of the overhead transport vehicle 30B as viewed in the plan view. Therefore, the first portion 38A and the second portion 39B do not interfere with each other, and the overhead transport vehicles 30A, 30B can both place the articles W simultaneously or concurrently to the adjacent first transfer location S1 and second transfer location S2.

While the above describes placing articles W at both the first transfer location S1 and the second transfer location S2, it is also possible for both of the overhead transport vehicles 30A, 30B to receive articles W simultaneously or concurrently from the adjacent first transfer location S1 and second transfer location S2 without the first portion 38A and the second portion 39B interfering with each other, when receiving the articles W from both the first transfer location S1 and the second transfer location S2.

Also, in placing an article W at one of the first transfer location S1 and the second transfer location S2 and receiving an article W from the other, it is, similarly, possible for the overhead transport vehicle 30A to place an article W at the first transfer location S1 and for the overhead transport vehicle 30B to receive an article W from the second transfer location S2 simultaneously or concurrently, without the first portion 38A and the second portion 39B interfering with each other.

The expression "simultaneously" also means that after the overhead transport vehicles 30A, 30B have stopped, one or both of the timing to start the operation of transferring the article W and the timing to end the operation of transferring the article W coincide with each other for the overhead transport vehicles 30A, 30B. The expression "concurrently" means that the period of time required for the overhead transport vehicle 30A to perform the operation of transferring the article W overlaps at least partially with the period of time required for the overhead transport vehicle 30B to perform the operation of transferring the article W. For example, as shown in FIG. 1 when the first transfer location S1 and the second transfer location S2 are at the same height since the overhead transport vehicle 30A stops at a position higher than that of the overhead transport vehicle 30B, the period of time required for the overhead transport vehicle 30A to perform the operation to transfer the article W is longer than the period of time required for the overhead transport vehicle 30B to perform the operation to transfer the article W. The expression "concurrently" also includes when the overhead transport vehicle 30B ends the operation of transferring the article W during the period of time required for the overhead transport vehicle 30A to perform the operation of transferring the article W.

As described above, according to the transport vehicle system SYS1, even when the overhead transport vehicle 30A on the first track 10 and the overhead transport vehicle 30B on the second track 20 transfer articles W simultaneously or concurrently to the first transfer location S1 and the second transfer location S2, the port pitch P of which is less than the overall length VL of the overhead transport vehicle 30 in the extending direction D since the first portion 38A is offset from the second portion 39B as viewed in the plan view, it is possible to prevent interference between the overhead transport vehicles 30, that is, interference between the first portion 38A and the second portion 39B. As a result, articles W can be transferred simultaneously or concurrently to the first transfer location S1 and second transfer location S2 adjacent to each other, and the efficiency of transporting articles W can be improved.

While an example of transferring articles W to the first transfer location S1 and the second transfer location S2 is described in FIG. 5, transferring articles W to the second transfer location S2 and the first transfer location S3 can also be described in a similar manner. That is to say, the overhead transport vehicle 30A stopped at the first position P1 corresponding to the first transfer location S3 and the overhead transport vehicle 30B stopped at the second position P2 can transfer articles W simultaneously or concurrently to the second transfer location S2 and the first transfer location S3 adjacent to each other.

As shown in FIG. 1, three overhead transport vehicles 30 can also transfer articles W simultaneously or concurrently to the first transfer locations S1, S3 and the second transfer location S2. In the example shown in FIG. 1, two overhead transport vehicles 30A stopped on the first track 10 (upper track) are each transferring an article W to two first transfer locations S1, S3, and one overhead transport vehicle 30B stopped on the second track 20 (lower track) is transferring an article W to one second transfer location S2. However, my systems are not limited to this example. For example, as opposed to FIG. 1, where of the three load ports LP, two on both sides are second transfer locations S2 and one in the center is a first transfer location S1, the two overhead transport vehicles 30B stopped on the second track 20 may each transfer an article W to the two second transfer locations S2, and the single overhead transport vehicle 30A stopped on the first track 10 may transfer an article W to the single first transfer location S1.

Second Example

Figure 6:
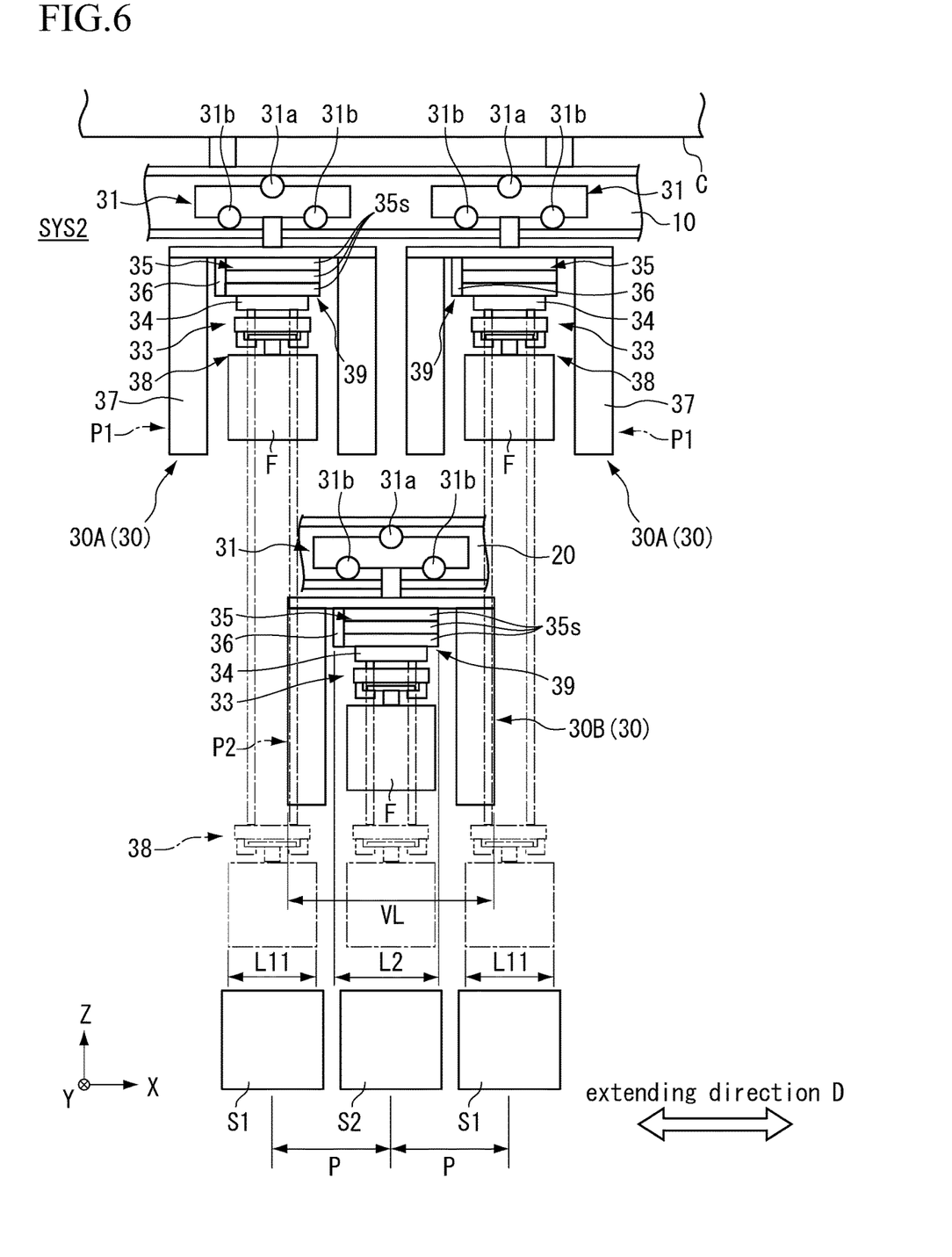
FIG. 6 is a diagram showing a second example of a transport vehicle system as viewed in the Y direction.

FIG. 6 is a diagram showing a second example of a transport vehicle system SYS2 as viewed in the Y direction. The transport vehicle system SYS2 shown in FIG. 6 transports articles F such as FOUPs accommodating semiconductor wafers used to manufacture semiconductor devices. The article F is larger than the article W (reticle pod) of the first example, and is larger than the holder 33 as viewed in the plan view.

The first transfer location S1 and the second transfer location S2 to which articles F are transferred are larger in size in the extending direction D to correspond to the articles F, and are larger than the first transfer location S1 and the second transfer location S2 of the first example. The other configurations are similar to those in the first example. The port pitch P, which is a distance between the first transfer location S1 and the second transfer location S2, is illustrated similar to that in the first example. However, it may be changed, depending on the size of the article F or on the settings of the processing apparatus TL. Since the first position P1 and the second position P2 are set according to the first transfer location S1 and the second transfer location S2, if the port pitch P changes (that is to say, if the positions of the first transfer location S1 and the second transfer location S2 change), the first position P1 and the second position P2 are changed according to the changed positions of the first transfer location S1 and the second transfer location S2.

Figure 7:
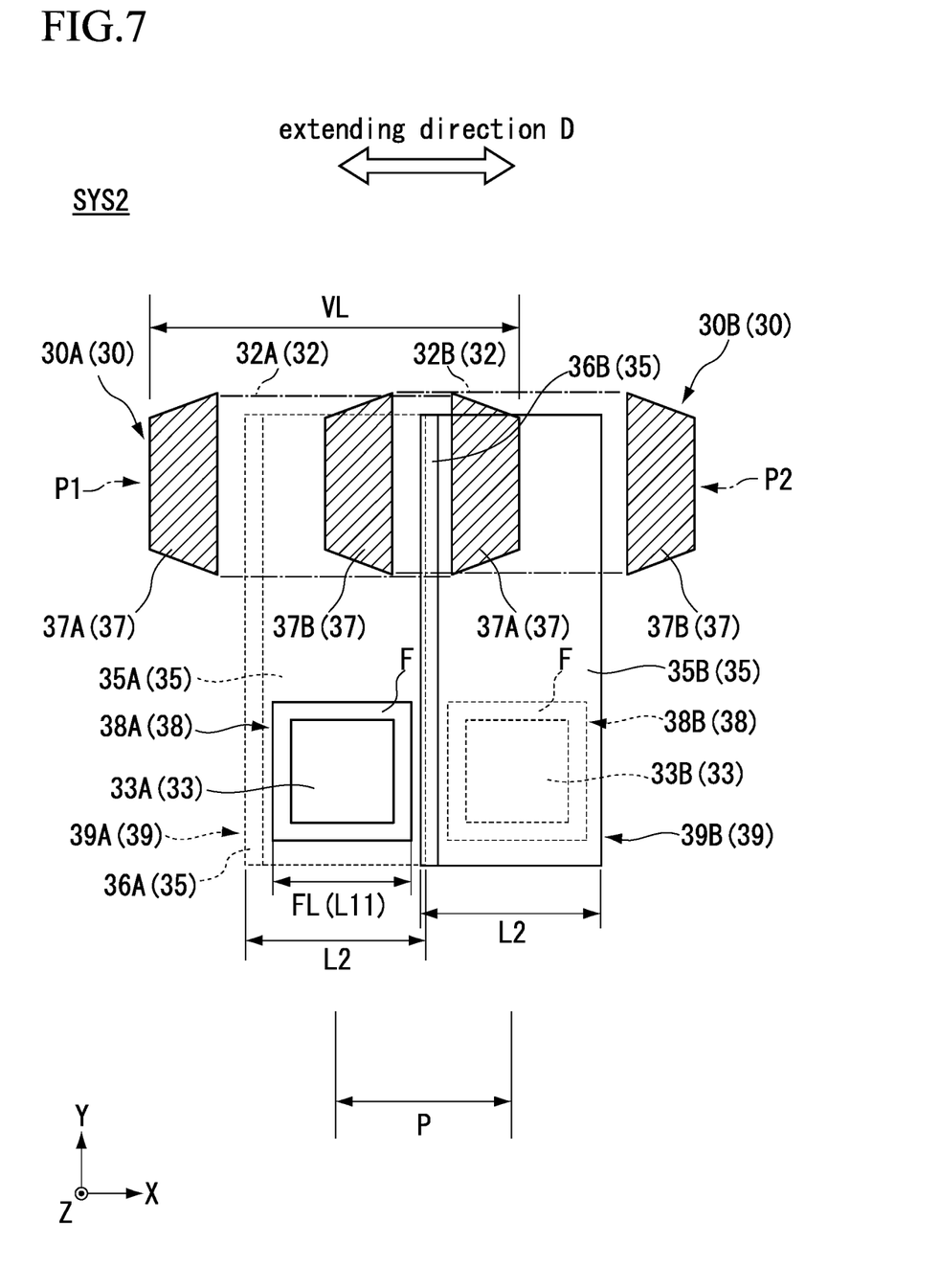
FIG. 7 is a diagram showing the second example of overhead transport vehicles stopped at a first position and a second position in the transport vehicle system.

FIG. 7 is a diagram showing the second example of the overhead transport vehicles 30 having stopped at the first position P1 and the second position P2, in the transport vehicle system SYS2. In this example, the dimension FL of the article F in the extending direction D is larger than the dimension of the holder 33 in the extending direction D as viewed in the plan view. As a result, the outer edge of the article F held by the holder 33 in the extending direction D protrudes to the outside of the outer edge of the holder 33 as viewed in the plan view. Therefore, the dimension L11 of the first portion 38 in the extending direction D is the same as the dimension FL of the article F in the extending direction D.

As shown in FIG. 7, as viewed in the plan view, the first portion 38A, which is raised or lowered by the lift driver 34A, of the overhead transport vehicle 30A stopped at the first position P1 on the first track 10 for transferring the article F to the first transfer location S1 is offset from the second portion 39B, which is moved in the lateral direction by the drive of the lateral extender 35B, of the overhead transport vehicle 30B stopped at the second position P2 on the second track 20 for transferring the article F to the second transfer location S2.

In this example, as with the first example, the first portion 38A is the holder 33A as well as the article F held by the holder 33A. Also, as with the first example, the second portion 39B is the movable plates 35s of the lateral extender 35B (see FIG. 2) as well as the auxiliary 36B. In FIG. 7, the lateral extender 35A of the overhead transport vehicle 30A is shown in broken lines, the holder 33A and the article F are shown in solid lines, the lateral extender 35B of the overhead transport vehicle 30B is shown in solid lines, and the holder 33B and the article F are shown in broken lines.

As with the first example, the first portion 38A of the overhead transport vehicle 30A stopped at the first position P1 is offset in the extending direction D (X direction) from the second portion 39B of the overhead transport vehicle 30B stopped at the second position P2 to not overlap with each other as viewed in the plan view. Therefore, when lowering the first portion 38A by the lift driver 34A of the overhead transport vehicle 30A, it does not interfere with the second portion 39B of the overhead transport vehicle 30B. As a result, the overhead transport vehicle 30A on the first track 10 and the overhead transport vehicle 30B on the second track 20 can transfer articles F simultaneously or concurrently.

The second example is similar to the first example in that the dimension L11 of the first portion 38A in the extending direction D is less than the dimension L2 of the second portion 39A in the extending direction D, and in a plan view, the first portion 38A is within the outer edge of the second portion 39A.

As described above, in the transport vehicle system SYS2, even when the dimension FL of the article F in the extending direction D is larger than the dimension of the holder 33 in the extending direction D, the first portion 38A includes the article F, and the first portion 38A is offset from the second portion 39B in a plan view. As a result, while it is possible to prevent interference between the overhead transport vehicles 30, that is, interference between the first portion 38A of the overhead transport vehicle 30A on the first track 10 and the second portion 39B of the overhead transport vehicle 30B on the second track 20, it is also possible to transfer articles F from both the overhead transport vehicle 30A and the overhead transport vehicle 30B simultaneously or concurrently to the first transfer location S1 and the second transfer location S2 adjacent to each other. Therefore, the efficiency of transporting the articles F can be improved.

The examples have been described above. However, my systems are not limited to the above description, and various modifications may be made without departing from the scope of this disclosure. The contents of Japanese Patent Application No. 2019-055601 and all documents cited herein are incorporated herein by reference. For example, while the load ports LP have been described as an example of the first transfer location S1 and the second transfer location S2 in the above transport vehicle systems SYS1, SYS2, my systems are not limited to this configuration. As the first transfer location S1 and the second transfer location S2, the racks 41 of the storage 40 can also be similarly described.

For example, as shown in FIG. 3, the racks 41 adjacent to each other in the extending direction D in the storage 40 serve as the first transfer location and the second transfer location, respectively. To the case where the port pitch P, which is an interval between the first transfer location and the second transfer location, is smaller than the overall length VL of the overhead transport vehicle 30, a description similar to the description of the first transfer location S1 and the second transfer location S2 at the load port LP as described above can also apply.

The invention claimed is:

1. A transport vehicle system comprising:
a first track;
a second track provided below the first track and extending in the same extending direction as that of the first track; and
an overhead transport vehicle that travels on the first track and the second track and transfers articles to a first transfer location and a second transfer location adjacent to each other in the extending direction, wherein
the overhead transport vehicle includes a main body, a holder that holds an article, a lift driver that raises or lowers the holder, and a lateral extender that moves the lift driver from the main body in a lateral direction,
a port pitch, which is an arrangement interval between a center of the first transfer location and a center of the second transfer location, is less than the overall length of the overhead transport vehicle in the extending direction, and
a first portion of the overhead transport vehicle stopped at a first position on the first track to transfer an article to the first transfer location, which first portion is raised or lowered by the lift driver and is offset in the extending direction from a second portion, which is moved in a lateral direction by the drive of the lateral extender, of the overhead transport vehicle stopped at a second position on the second track to transfer an article to the second transfer location.

2. The transport vehicle system according to claim 1, wherein the first portion includes an article held in the holder.

3. The transport vehicle system according to claim 1, wherein in a plan view, the first portion is within the outer edge of the second portion.

4. The transport vehicle system according to claim 1, wherein
the overhead transport vehicle includes an auxiliary that, when the lateral extender causes the lift driver to move laterally, is moved laterally together therewith, and
the auxiliary is included in the second portion.

5. The transport vehicle system according to claim 1, wherein in the extending direction, a range of the second portion of the overhead transport vehicle stopped at the first position and a range of the second portion of the overhead transport vehicle stopped at the second position partially overlap with each other.

6. The transport vehicle system according to claim 2, wherein in a plan view, the first portion is within the outer edge of the second portion.

7. The transport vehicle system according to claim 2, wherein the overhead transport vehicle includes an auxiliary that, when the lateral extender causes the lift driver to move laterally, is moved laterally together therewith, and the auxiliary is included in the second portion.

8. The transport vehicle system according to claim 3, wherein the overhead transport vehicle includes an auxiliary that, when the lateral extender causes the lift driver to move laterally, is moved laterally together therewith, and the auxiliary is included in the second portion.

9. The transport vehicle system according to claim 2, wherein in the extending direction, a range of the second portion of the overhead transport vehicle stopped at the first position and a range of the second portion of the overhead transport vehicle stopped at the second position partially overlap with each other.

10. The transport vehicle system according to claim 3, wherein in the extending direction, a range of the second portion of the overhead transport vehicle stopped at the first position and a range of the second portion of the overhead transport vehicle stopped at the second position partially overlap with each other.

11. The transport vehicle system according to claim 4, wherein in the extending direction, a range of the second portion of the overhead transport vehicle stopped at the first position and a range of the second portion of the overhead transport vehicle stopped at the second position partially overlap with each other.

\* \* \* \* \*